United States Patent [19]
Dowling

[11] Patent Number: 5,971,698
[45] Date of Patent: Oct. 26, 1999

[54] AUTOMATIC CONVEYING APPARATUS FOR WAFFLE PACK CARRIER MEMBER

[75] Inventor: James L. Dowling, Milford, N.H.

[73] Assignee: Laurier Inc., Londonderry, N.H.

[21] Appl. No.: 09/020,868

[22] Filed: Feb. 9, 1998

[51] Int. Cl.[6] .................................................. B65G 60/00
[52] U.S. Cl. ..................................... 414/788.7; 198/465.1; 414/797.9; 414/801
[58] Field of Search ................................ 198/465.1, 535, 198/560, 561; 414/788.4, 788.7, 788.8, 797.5, 797.9, 801, 806

[56] References Cited

U.S. PATENT DOCUMENTS

| 3,289,861 | 12/1966 | Carle et al. | 414/797.5 X |
| 3,620,385 | 11/1971 | Vermeijlen et al. | 414/788.8 |
| 4,693,659 | 9/1987 | Burke et al. | 414/797.9 |
| 4,789,079 | 12/1988 | Kobayashi et al. | 414/797.9 X |
| 5,441,380 | 8/1995 | Horikawa | 414/788.7 |

FOREIGN PATENT DOCUMENTS

| 2322945 | 11/1974 | Germany | 198/465.1 |

*Primary Examiner*—Janice L. Krizek
*Attorney, Agent, or Firm*—Davis and Bujold

[57] ABSTRACT

A conveying apparatus for sequentially feeding a plurality of stacked carrier members, each carrying a plurality of components to be assembled, to an automatic assembly retrieval area where the plurality of components can be retrieved to manufacture a desired product. The conveying apparatus includes a supply bin for storing a desired quantity of stacked carrier members and a feed mechanism which sequentially feeds one of the stacked carrier members from the supply bin to a conveyor mechanism. The conveyor mechanism conveys the supplied carrier member to the automated assembly retrieval area where the components are retrieved. Once all of the components are properly placed on a desired product, the conveyor mechanism conveys a new carrier member, containing a fresh supply of components, to the automated assembly retrieval area and simultaneously conveys the emptied carrier member to a collection bin which facilitates collection of the emptied carrier member. The supply and collection bins can be provided with an elevator assembly which maintains a desired spacing between an exit of the conveyor mechanism and a collection surface of the collection bin.

20 Claims, 14 Drawing Sheets

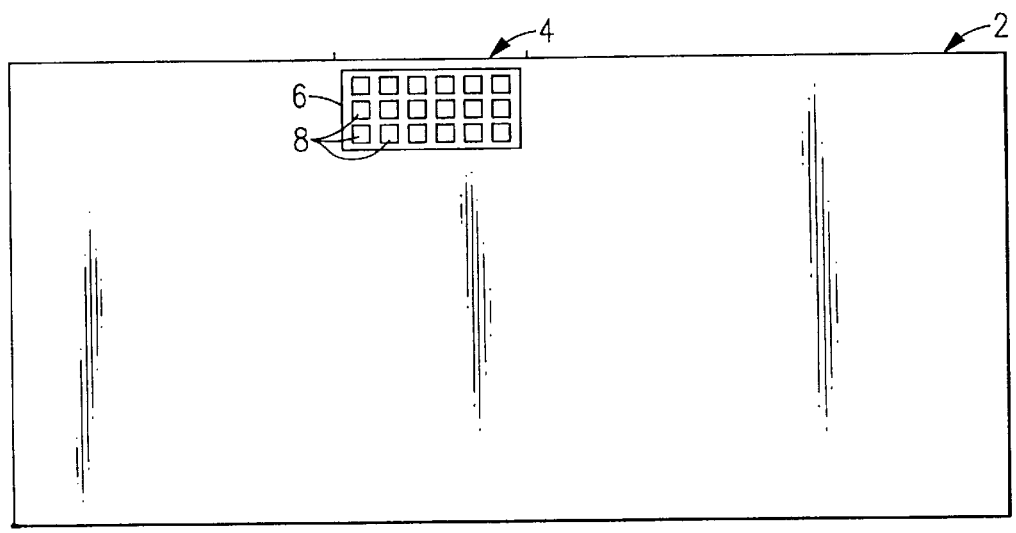
FIG. 1 PRIOR ART
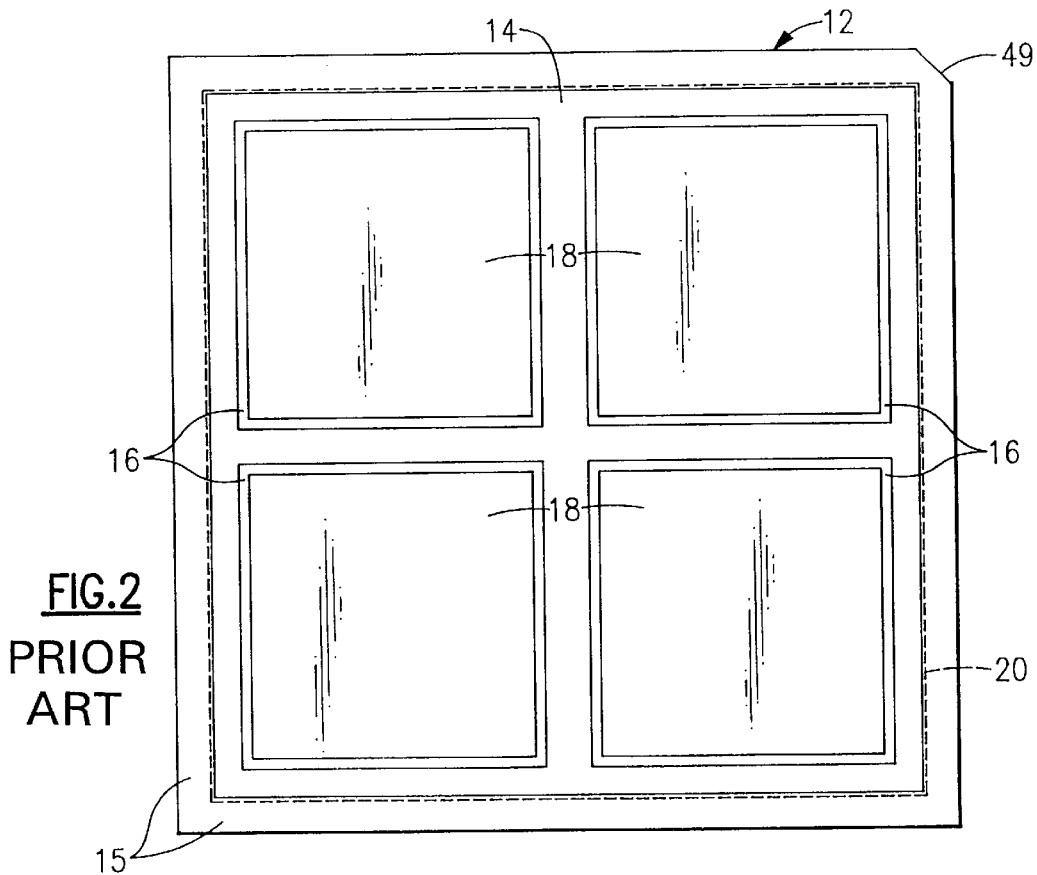
FIG. 2 PRIOR ART
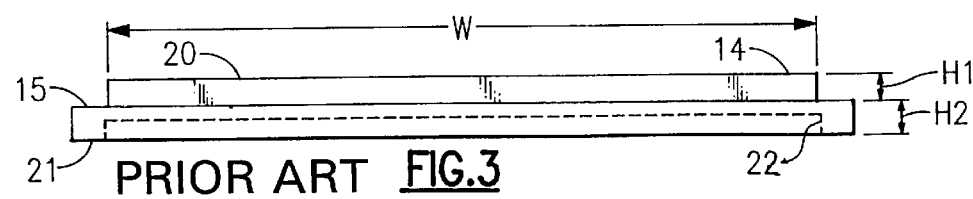
PRIOR ART FIG. 3

AUTOMATIC CONVEYING APPARATUS FOR WAFFLE PACK CARRIER MEMBER

The present invention relates to a conveying apparatus for sequentially conveying a plurality of nestable or stackable carrier members and, in particular, for sequentially conveying a plurality of nested waffle packs, commonly referred to as "chip trays" or "matrix trays", each containing a plurality of integrated circuit devices (die) or some other electronic components, to an automated assembly system where the supplied components can be retrieved and used for production of various end products.

BACKGROUND OF THE INVENTION

A variety of automated assembly systems currently exist for assembling various electronic and computer components. However, all of the known prior art automated assembly systems typically work as batch cycles when retrieving components from waffle packs. One such automated assembly system 2 is diagrammatically shown in FIG. 1. Once all of the supplied components are assembled on the end product(s), the automated assembly system 2 must be temporarily shut down to replenish the supply of components. This is typically done by opening a side panel or door 4, of the automated assembly system 2, and replacing an empty tray 6 with a new tray 6 containing a plurality of carrier members 8 which each support additional components to be assembled into end product(s). Once a new supply of components is provided, the automated assembly system 2 then recommences operation to place the additional components, as required, and assemble the desired end product(s).

As the known prior art automated assembly systems 2 work very rapidly, the supply of provided components is utilized fairly quickly, e.g. usually within a few seconds to a few minutes or so. Each time the quantity of supplied components is completely retrieved from the carrier members, the automated assembly system 2 must be temporarily interrupted or shutdown so that a new reserve of components can be supplied to the automated assembly system 2. Once the supply of components is replenished, a further batch cycle can occur. This procedure is continuously repeated throughout a work shift of each work day.

As is apparent from the above brief discussion, the known prior art automated assembly systems have a couple of associated drawbacks. In particular, such automated assembly systems are batch cycle systems rather than continuous feed systems thus requiring numerous interruptions in the manufacturing process during the work shift of each work day. In addition, as a relatively bulky carrier tray is utilized to supply components to be assembled, a significant amount of important working space or area, within the interior of the automated assembly system, is utilized to accommodate the carrier members supporting the components to be assembled. Further, the automated assembly system must to be programmed to pick up components to be assembled from a plurality of different locations on the tray, rather than a single location or a relatively small number of locations, and assemble them properly on the product being manufactured by the automated assembly system.

SUMMARY OF THE INVENTION

Wherefore it is an object of the present invention to overcome the aforementioned drawbacks.

A further object of the invention is to provide a conveying apparatus, for a plurality of nested carrier members, which sequentially supplies one of the nested carrier members, carrying a plurality of components to be assembled, to an automated assembly system as required.

Another object of the invention is to provide a conveying apparatus which facilitates automatic collection of each one of the supplied carrier members, from the automated assembly system, once all the supplied components carried thereby are utilized by the automated assembly system.

A still further object of the invention is to provide a conveying apparatus which occupies a minimal amount of working area within the automated assembly system.

Yet another object of the invention is to provide a conveying apparatus in which at least the supply bin and the collection bin, of the feed apparatus, are readily accessible from an exterior of the automated assembly system so that a continuous supply of components can be provided to the automated assembly system without any significant interruption in the manufacturing process.

A still further object of the invention is to provide a conveying apparatus which minimizes the locations where the automated assembly system must be programmed to pick up the components to be assembled during the manufacturing process.

The present invention relates to a conveying apparatus for sequentially feeding a plurality of stacked carrier members each carrying a plurality of components to be assembled, said conveying apparatus comprising: a supply bin for storing a desired quantity of stackable carrier members, said supply bin having an outlet for sequentially discharging a carrier member therefrom; a feed mechanism communicating with said outlet of said supply bin, and said feed mechanism facilitating feeding of said carrier members, in a sequential manner, when located within said supply bin; and a conveyor mechanism communicating with said outlet of said supply bin for receiving said carrier member, fed by said feed mechanism, and for conveying said carrier member to an automated assembly retrieval area where said plurality of components of said carrier member can be retrieved to manufacture a desired product.

Lastly, the present invention relates to a method for sequentially feeding a plurality of stacked carrier members each carrying a plurality of components to be assembled, said method comprising the steps of storing a desired quantity of stackable carrier members in a supply bin; providing said supply bin with an outlet for sequentially discharging said carrier members therefrom; providing a feed mechanism communicating with said outlet of said supply bin; feeding in a sequential manner, via said feed mechanism, one of said carrier members as desired; and receiving and conveying said sequentially fed carrier member, via a conveyor mechanism, to an automated assembly retrieval area where said plurality of components of said carrier member can be retrieved to manufacture a desired product.

BRIEF DESCRIPTION OF THE DRAWINGS

The invention will now be described, by way of example, with reference to the accompanying drawings in which:

FIG. 1 is diagrammatic plan view showing a prior art automated assembly system;

FIG. 2 is diagrammatic top plan view showing a preferred prior art carrier member for use with the present invention;

FIG. 3 is a diagrammatic front elevational view of the carrier member of FIG. 2;

DESCRIPTION OF THE PREFERRED EMBODIMENT

Figure 4:
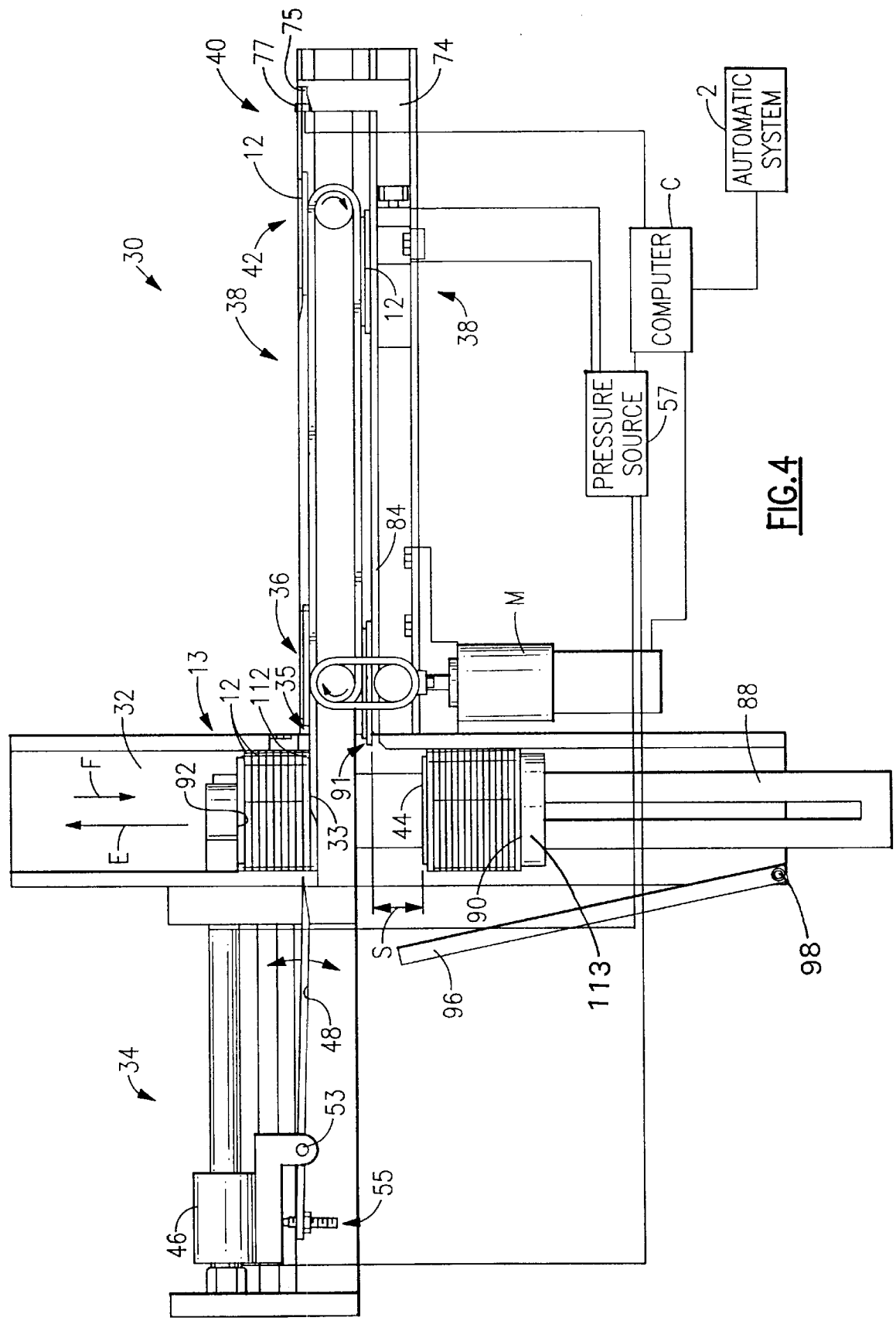
FIG. 4 is a diagrammatic front elevation view of the conveying apparatus according to the present invention.

Turning now to FIGS. 2 and 3, a brief description concerning a preferred prior art carrier member will now be provided. As can be seen in this Figure, the carrier member 12 has a top surface 14 which is provided with a plurality of cavities 16 therein, e.g. between about 4 to 200 cavities, which are each able to accommodate a desired component 18 to be assembled by the automated assembly system 2. A portion of the top surface 14 of the carrier member 12 is partially recessed or removed to form a perimeter shoulder 15 extending around the carrier member 12. The narrower width top surface of the carrier member 12 forms a protrusion 20. The bottom surface of the carrier member 12 is provided with a recessed area 22 which is sized and shaped to matingly accommodate the protrusion 20 of another mating carrier member 12 to facilitate nesting or stacking of the plurality of separate carrier members 12, one on top of and closely adjacent the other. Such stacking feature allows a plurality of carrier members 12 to be located, one on top of the other, and prevent the components 18, carried by each carrier member 12, from being inadvertently lost or separated from the associated cavity 16 supporting the component 18. Each one of the carrier members 12 is provided with an alignment notch 49 located at an intersection of two connecting sidewalls, e.g. a remove portion, and the purpose of the alignment notch 49 will be explained below.

It is to be appreciated that the recessed area 22 and the protrusion 20 of the carrier member 12 can be reversed, if so desired, i.e. the top surface 14 of the carrier member 12 is provided with the recessed area 22 which supports the cavities 16 while the bottom surface of the carrier member 12 is provided with the mating protrusion 20.

Figure 5:
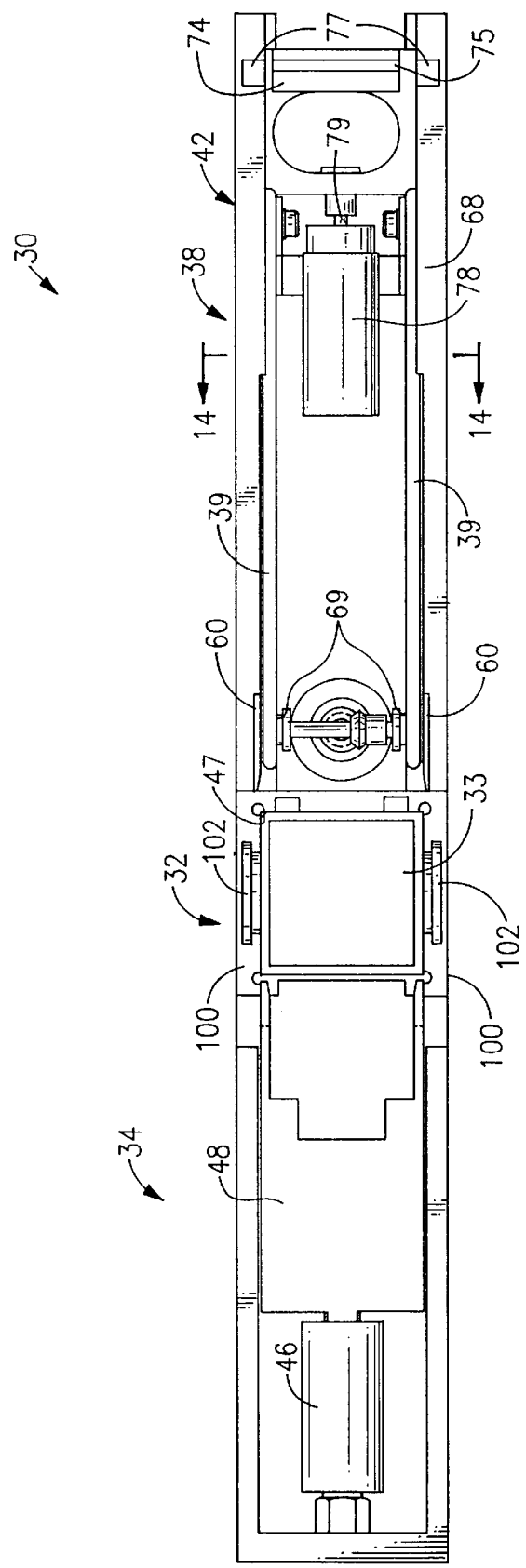
FIG. 5 is a diagrammatic top plan view of the conveying apparatus of FIG. 4 with a top portion of the elevator assembly removed for reasons of clarity.

Turning now to FIGS. 4 and 5, a brief discussion concerning the conveying apparatus :30 of the present invention will now be provided. As can be seen in those Figures, the automated conveying apparatus 30 comprises a supply bin 32 for holding a desired quantity of stacked carrier members 12, e.g. waffle packs. The bottom portion of the supply bin 32 has an outlet 35 which communicates with a feed mechanism 34 to sequentially feed the carrier members 12, one at a time, onto a starting first section 36 of a conveyor mechanism 38. The conveyor mechanism 38, in turn, conveys each sequentially fed carrier member 12 to an automated assembly retrieval area 40, at a remote end 42 of the conveyor mechanism 38, where the carrier member 12 is temporarily held in a restrained position. Thereafter, the automated assembly equipment 2 can retrieve the components 18, carried by the carrier member, to assemble a desired product(s) being manufactured. Once all of the components 18, carried by the carrier member 12, are properly placed during the manufacturing process, the feed conveyor 38 is again activated to convey the emptied carrier member 12 back towards the feed mechanism 34 and discharge the empty carrier member 12 into a collection bin 44. While the empty carrier member 12 is being conveyed back towards the feed mechanism 34, another carrier member 12, containing a fresh supply of components 18 to be assembled, is simultaneously conveyed by the feed mechanism 34 to the automated assembly retrieval area 40. As each feed cycle typically only takes a few seconds or so, e.g. 2–4 seconds, the feed cycle does not significantly interfere with the continuous production of desired products by the automated assembly system 2.

As can be seen in FIG. 5, the supply bin 32 is provided with a fixed or removable key 47, or some other mating alignment surface, which is attached to one of the four corners of the supply bin 32. The key 47 cooperates with the alignment notch 49 formed in each of the carrier members 12 to facilitate correct orientation of the carrier members 12 as they are placed in the supply bin 32. This alignment feature ensures that when the carrier members 12 are fed and conveyed to the automated assembly retrieval area 40 of the conveyor mechanism 38, the conveyed components 18 are properly oriented, with respect to the conveyor mechanism 38, for accurate pick up and assembly by the automated assembly equipment 2.

Figure 6:
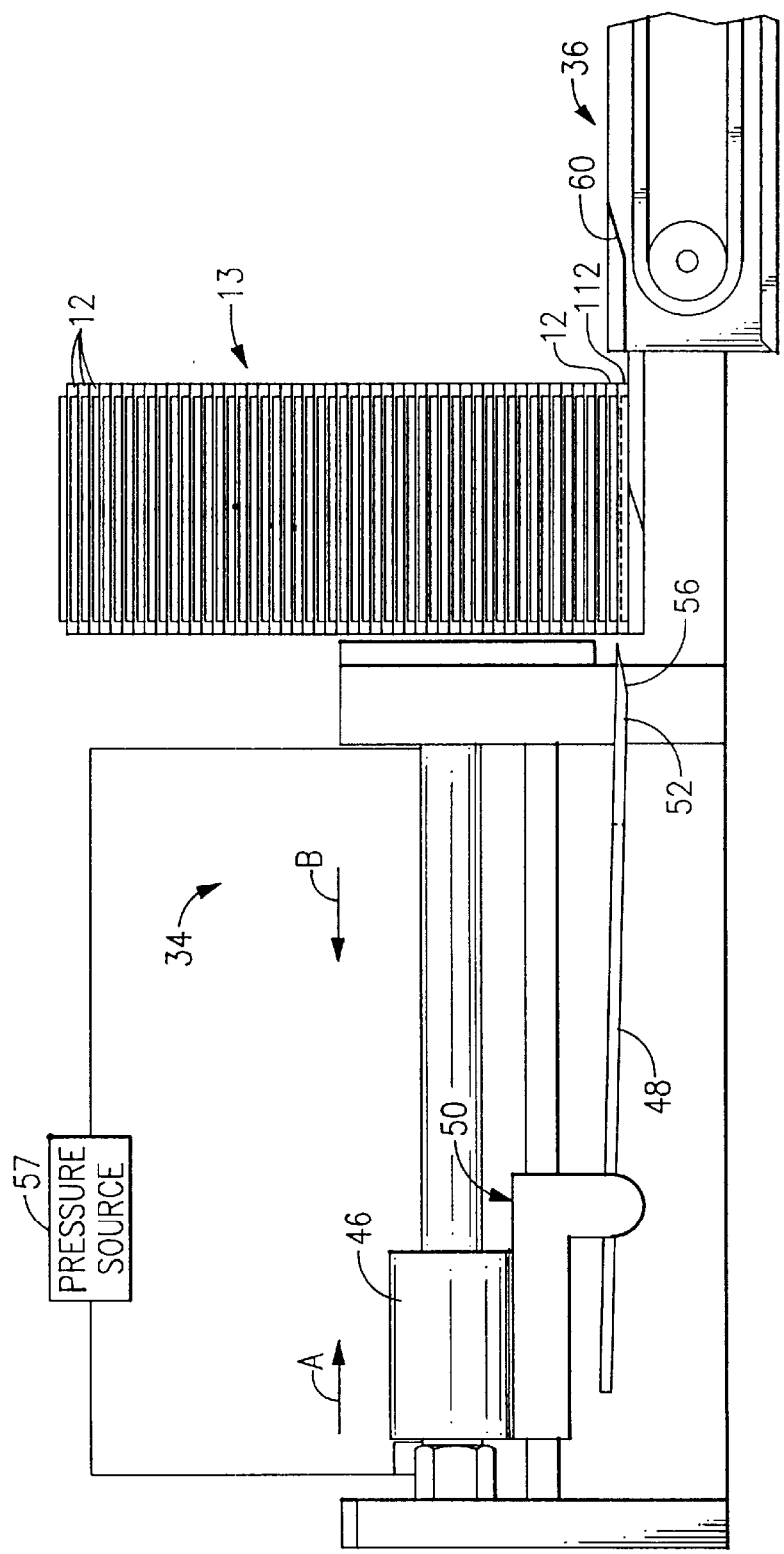
FIGS. 6 through 12 are diagrammatic views showing the feed sequence by the feed mechanism of a stacked carrier member onto the conveyor mechanism.
Figure 7:
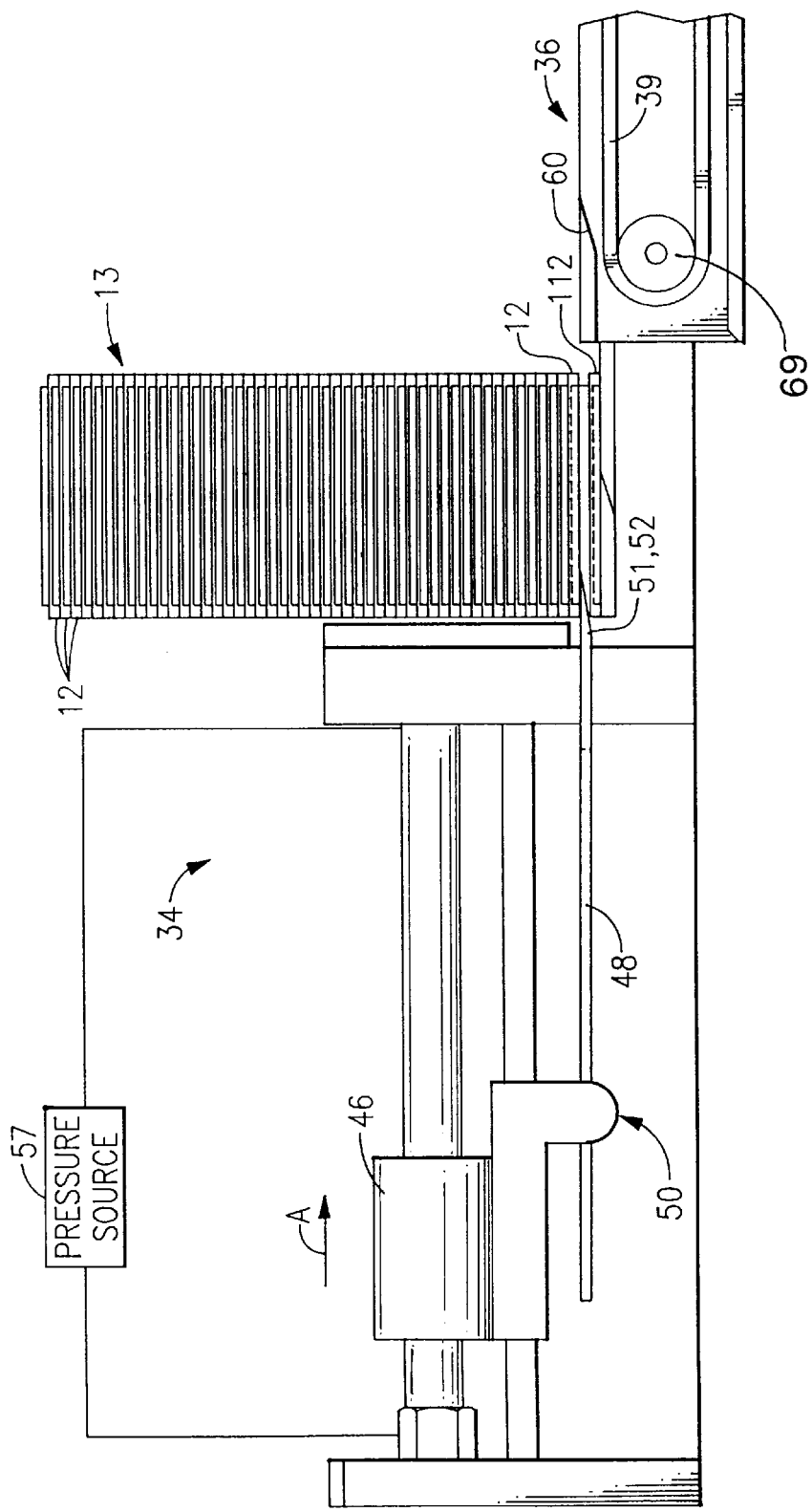
Figure 13:
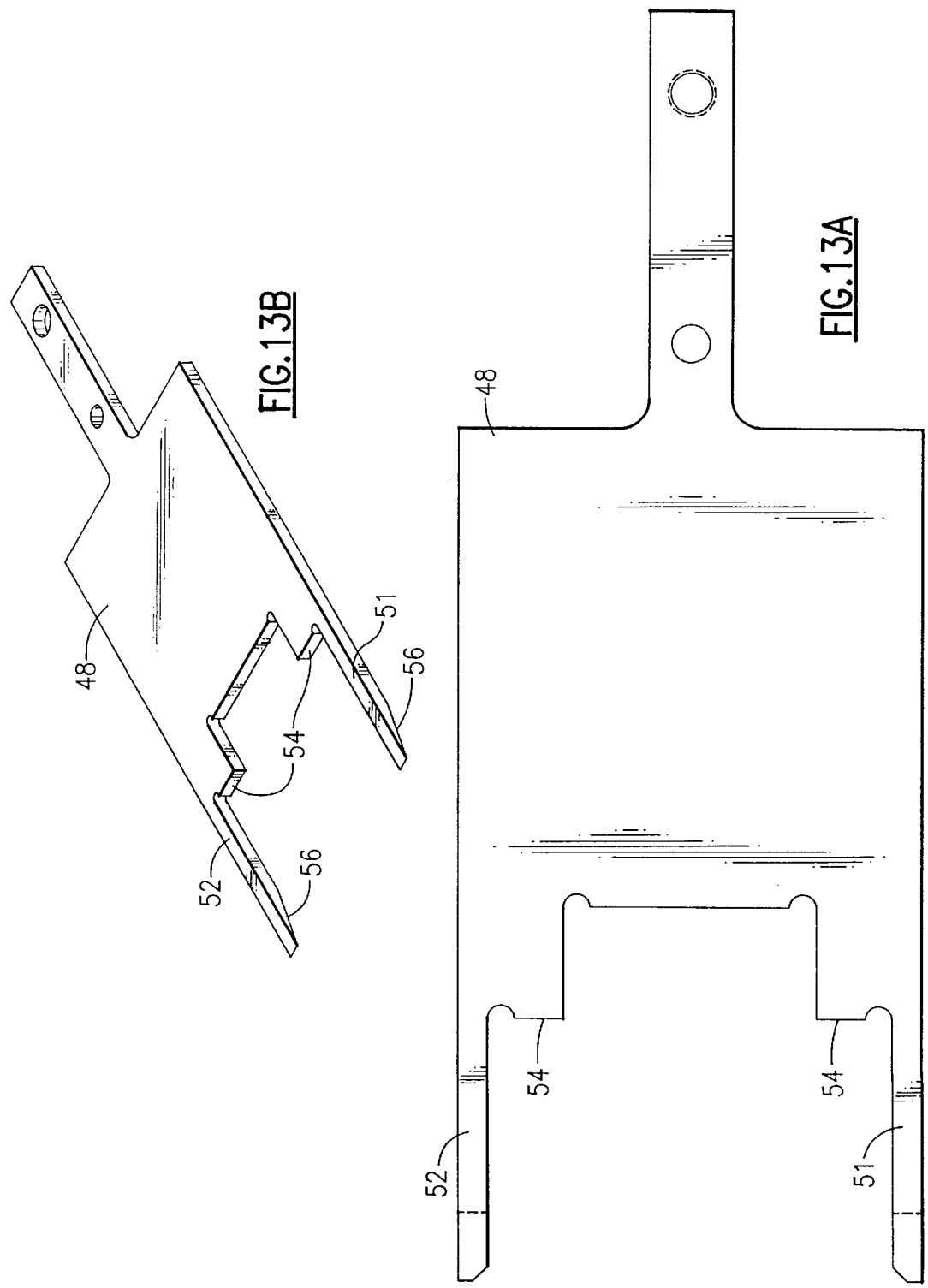
FIGS. 13A and 13B are top plan and perspective views, respectively, of a pusher element according to the present invention.

With reference now to FIGS. 6–12, a detailed description concerning the feed mechanism 34 of the present invention will now be provided. As can be seen in FIG. 6, the feed mechanism 34 comprises a conventional drive device such as a pneumatic cylinder 46 which is connected to a pusher element 48 by a rod assembly 50. The preferred pneumatic cylinder is a magnetically coupled rodless cylinder 46 which is well known in the art. The pusher element 48 (see FIGS. 13A and 13B) has a pair of arms 51, 52 which are spaced apart from one another by a distance which is slightly wider than the width W of the protrusion 20 of the carrier member 12 (see FIG. 2) to facilitate accommodation of the protrusion 20 of the carrier member 12 therebetween.

It is to be noted that one of the arms 51 of the pusher element 48 is shorter than the other arm 52, e.g. by a ¼ of an inch or so, so that the longer arm 52 initially contacts the stacked array 13 of carrier members 12 and commences the separation thereof before the second arm 51 contacts the stacked array 13. This sequential contact of the arms 51, 52 facilitates separation of the lower most carrier member 112 from a remainder of the stacked array 13 as will be described in further detail below. The pusher element 48 has a thickness which is slightly greater than a height H1 of the protrusion 20 of the carrier member 12 to facilitate complete separation of the lower most carrier member 112 from a remainder of a stacked array 13 of carrier members 12, and a further description concerning the purpose of the same will follow.

The pusher element 48 further comprises a pushing surface 54 to facilitate movement and loading of the lower most carrier member 112 onto a first section 36 of the conveyor mechanism 38. Each remote, free end of the arms 51, 52 is provided with a chamfer 56 to facilitate separation of two adjacent stacked carrier members 12 from one another. The inwardly facing surfaces of the arms 51, 52 can be chamfered as well to facilitate receiving a carrier member 12 between the arms 51, 52.

The rod assembly 50 comprises a support member 53 (FIG. 4) which pivotably supports an intermediate portion of the pusher element 48 to allow the pusher element 48 to pivot slightly, in an up and down fashion, to facilitate alignment of the leading edge of the arms 51, 52 with the joint between a top surface of the shoulder 15 of the lower most carrier member 112 and a bottom surface 21 of the next lower most carrier member 12 in the stacked array 13. In order to adjust the position of the leading edge of the arms 51, 52 the remote end of the pusher element 48 supports a spring biased plunge and threaded screw arrangement 55 which allows adjustment of the position of the leading edge of the pusher element 48, about the pivot 53, to facilitate desired alignment of the leading edge of the pusher element relative to the joint between two stack carrier members. In addition, the spring biased plunge portion of the spring and thread assembly 55 cushions the return of the pusher element 48 back to its adjusted position, following a feeding cycle, and a further description concerning the same will follow below.

As can be seen in FIG. 6, the feed mechanism 34 is shown in its idle stand-by position. When the automated assembly system 2 requires further components 18 to be assembled, the feed mechanism 34 is activated by a conventional pressurized source diagrammatically shown as element 57 (the fluid pressure, such as air, is supplied by the pressure source 57 to the left side of the pneumatic cylinder 46 as can be seen in FIG. 6 of the drawings), and the pneumatic cylinder 46 moves the pusher element 48 in the direction of arrow A, via the rod assembly 50, toward the stacked array 13 of carrier members 12 contained within the supply bin 32. The leading edge of the longer arm 52 of the pusher element 48, i.e. the narrowest portion of the longer arm 52, is positioned such that the arms 51, 52 are aligned with the joint between a top surface of the shoulder 15 of the lower most carrier member 112 and a bottom surface of the next lower most carrier member 12 in the stacked array 13. As the arms 51, 52 initially contact the stacked array 13, the arms 51, 52 cause a slight upward movement of the proximate end of the remainder of the stacked array 13 relative to the lower most carrier member 12 (see FIG. 7). The chamfer 56, on the arms 51, 52, facilitates separation of the lower most carrier member 112 from the remainder of the stacked array 13.

Figure 8:
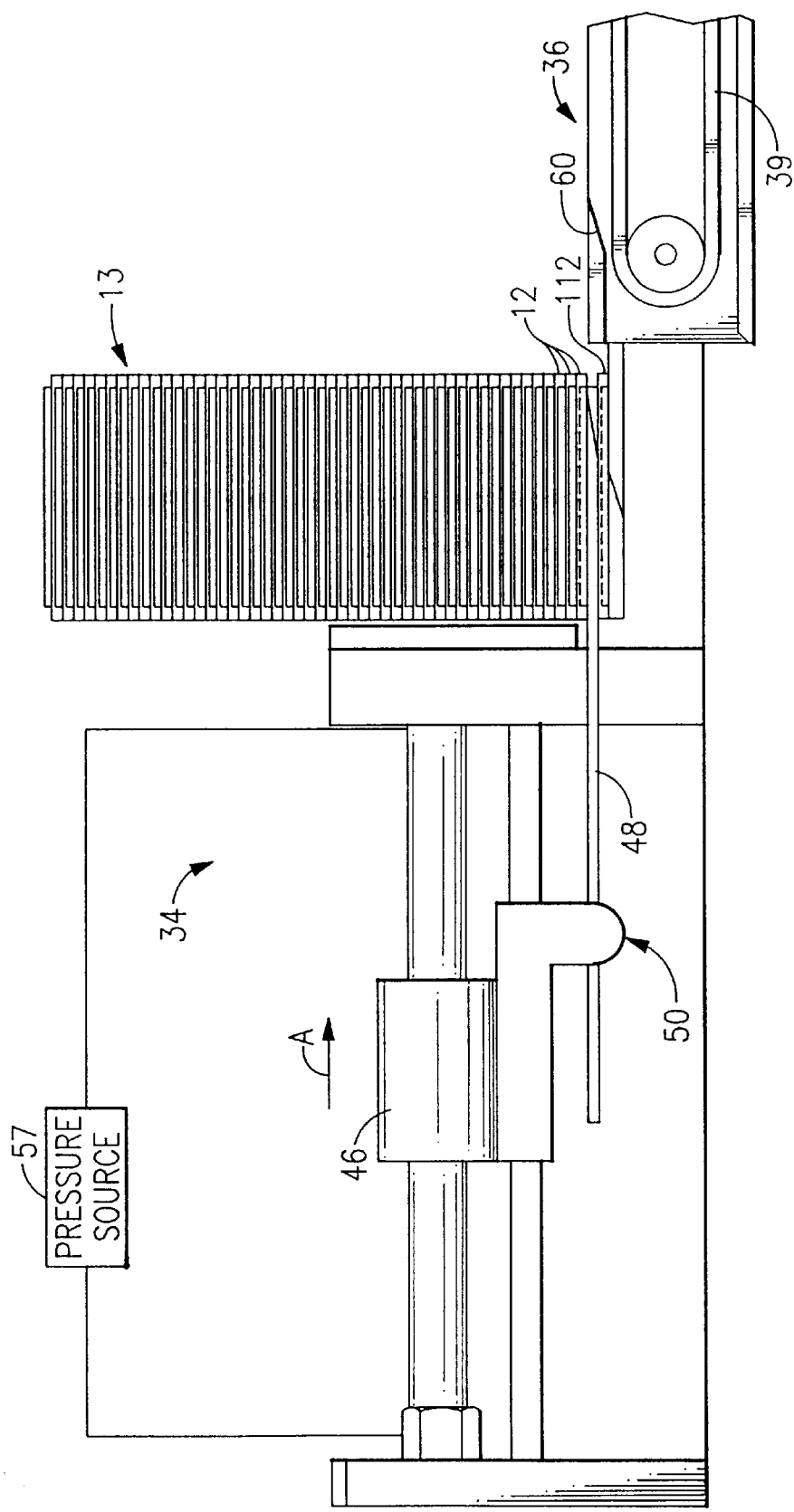
Figure 9:
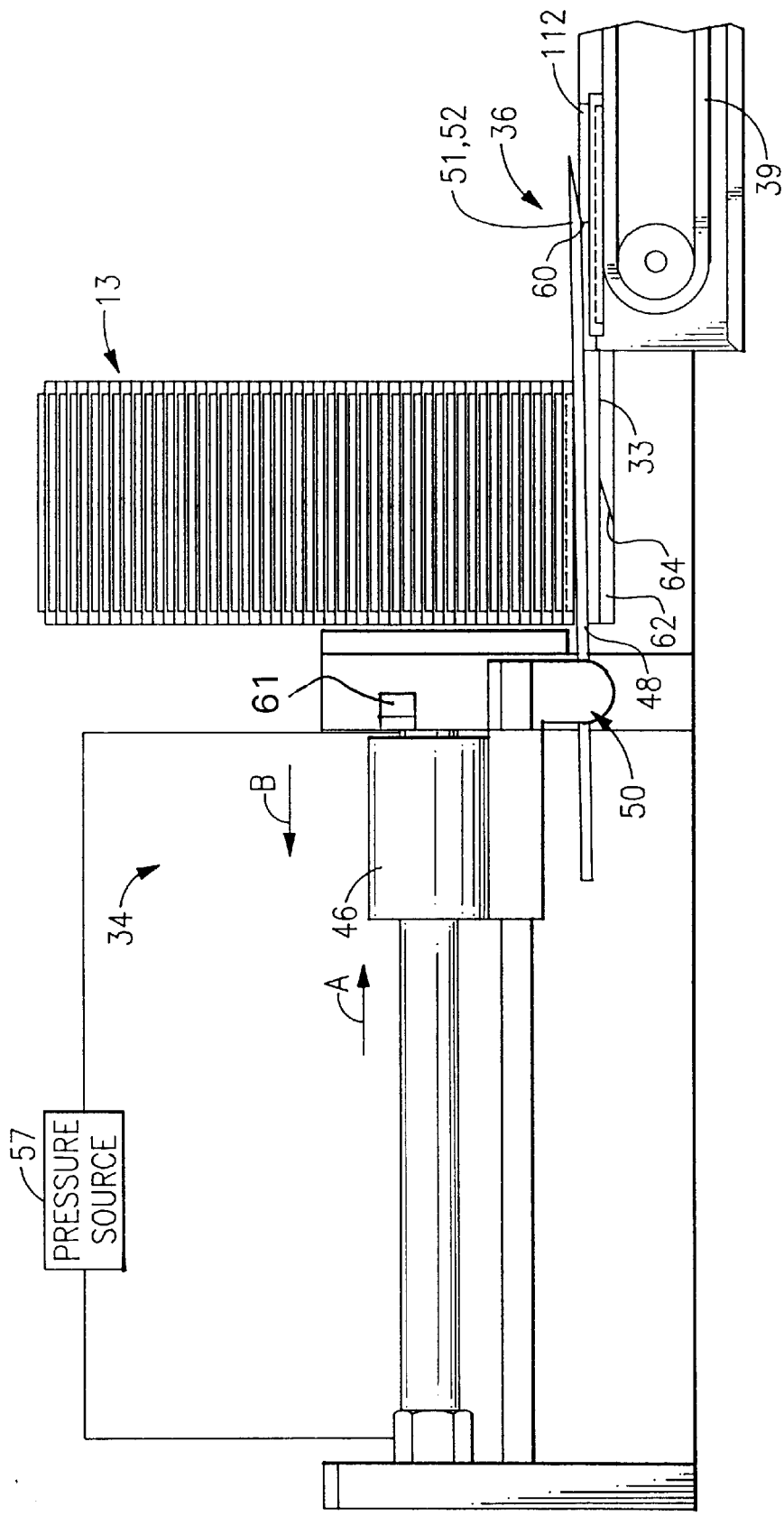

Continued movement of the arms 51, 52 in the direction of arrow A, relative to the stacked array 13, causes the remote end of the remaining carrier members 12 of the stacked array 13 to be gradually and gently lifted, relative to the lower most carrier member 112, until the arms 51, 52 are located between and completely separate the lower most carrier member 112 from the remainder of the stacked array 13 (see FIG. 8). Once this has occurred, the lower most carrier member 112 is completely separated from the remainder of the stacked array 13 and the pusher surface 54 then commences horizontal displacement of the lower most carrier member 112 relative to the remainder of the stacked array 13. This pushing motion, by the pushing surface 54 of the pusher element 48 in the direction of arrow A, causes the lower most carrier member 112 to be moved and loaded onto the first section 36 of the conveyor mechanism 38. As the pusher element 48 nears the completion of its loading stroke, the chambers 56 of the two arms 51, 52 engage with mating conveyor ramp surfaces 60, located adjacent the first section 36, to raise the pusher element 48, relative to both the carrier member 12 and the conveyor mechanism 38, and facilitate release and/or separation of the carrier member 12 from the pusher element 48. Once the pusher element 48 has been sufficiently raised and freed from the carrier member 12 (see FIG. 9), a pair of O-ring spaced apart conveyor belts 39, of the conveyor mechanism 38, convey the carrier member 12 toward the automated assembly retrieval area 40 of the conveyor mechanism 38. A motor M is coupled to a first return roller 69 of the conveyor belts 39, by a conventional pulley arrangement. Both first rollers 69 are connected to one another by a shaft to provide simultaneous rotation thereof by the motor M. It is to be appreciated that other conventional and well known drive mechanisms can also be provided for providing drive from the motor M to the conveyor belts 39.

Figure 10:
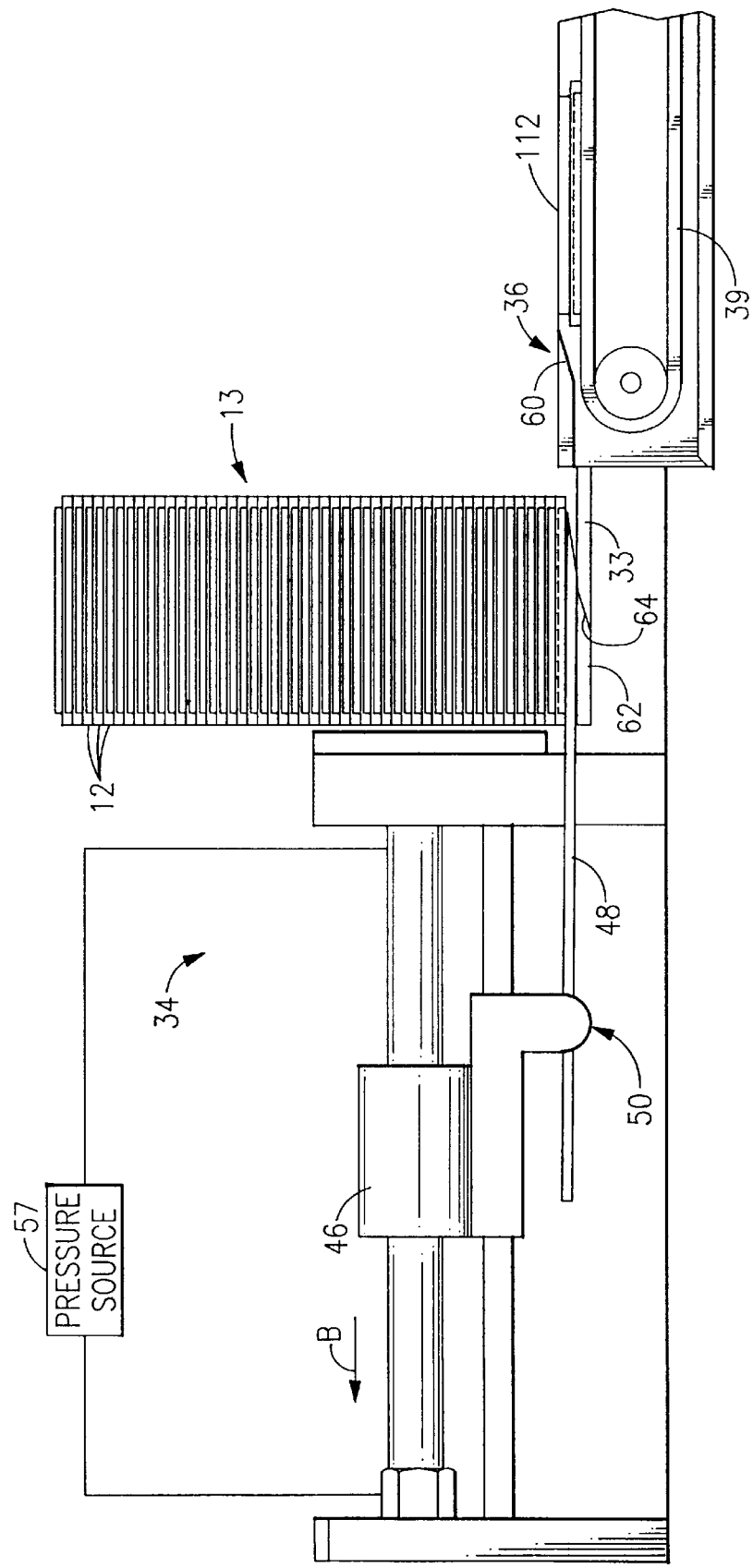
Figure 11:
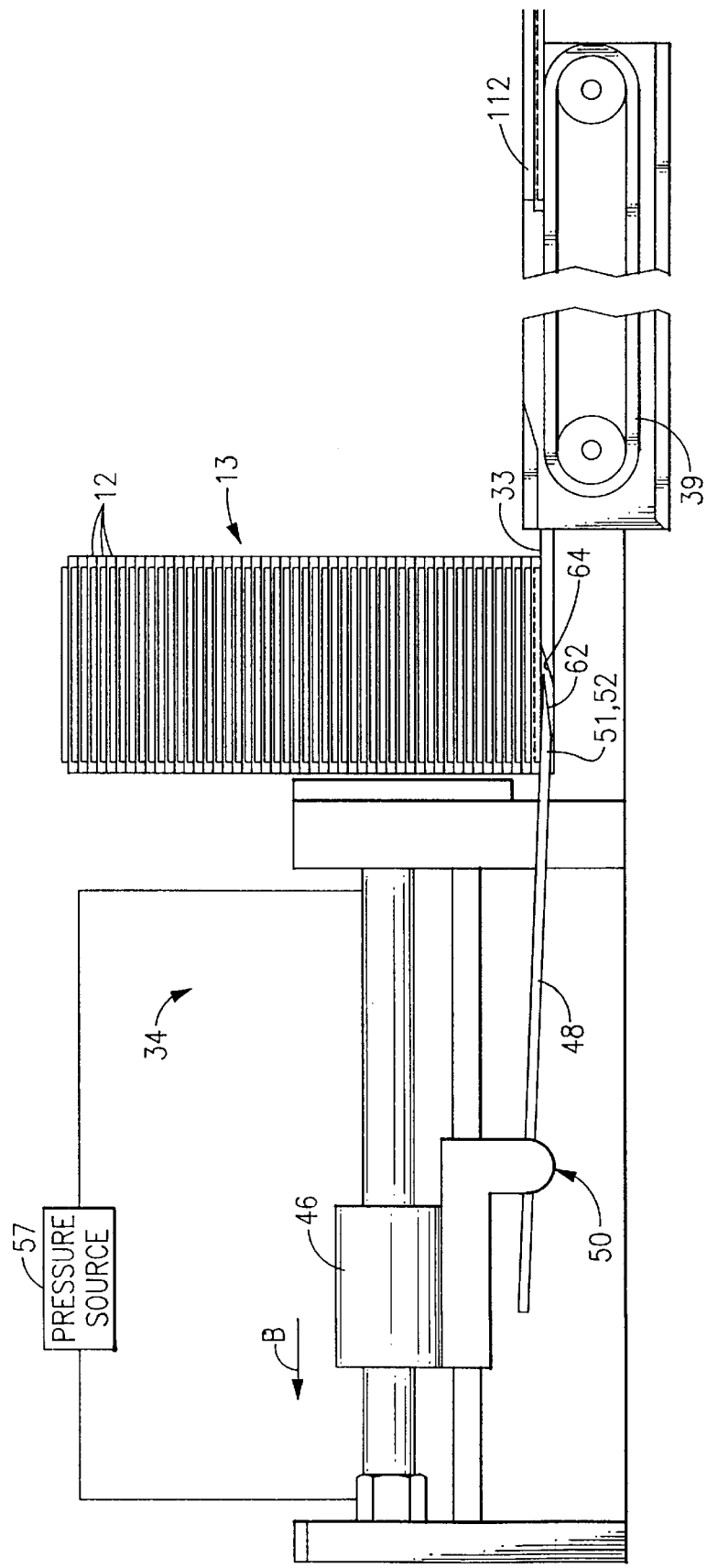
Figure 12:
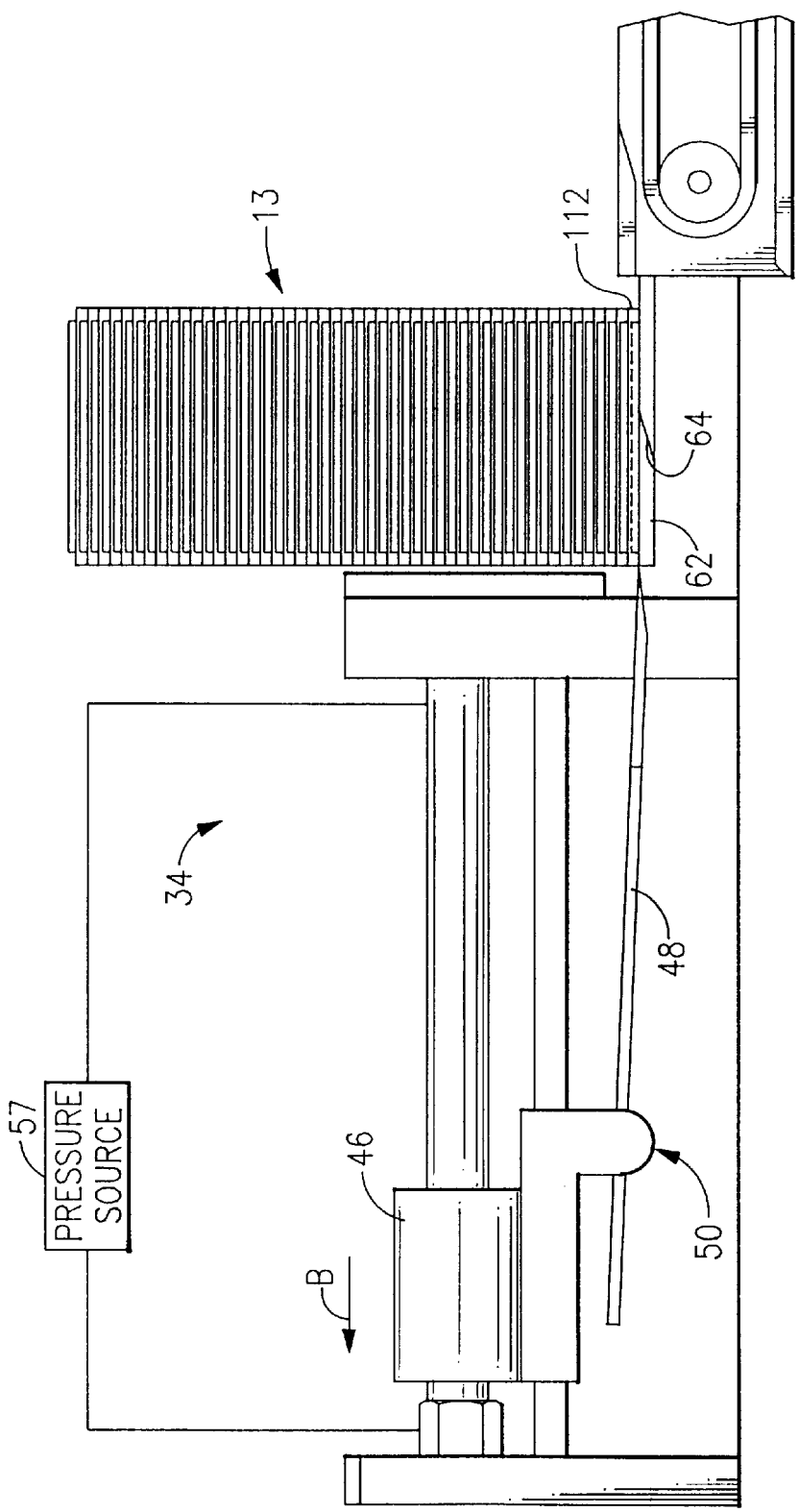

Thereafter, at the end stroke of the pneumatic cylinder 46, a sensor 61 is activated to reverse the pneumatic cylinder 46 and return the pneumatic cylinder 46 in the opposite direction indicated by arrow B (the fluid pressure, such as air, is now supplied by the pressure source 57 to the right side of the pneumatic cylinder 46 as can be seen in FIG. 6 of the drawings). The sensor 61 can be, for example, a magnetic reed switch in which a leading end of the pneumatic cylinder 46 is provided with a magnetic portion that activates the switch when the pneumatic cylinder 46 is moved to its maximum extended position so that the return stroke of the pneumatic cylinder 46 is thus activated. During this return stroke, the arms 51, 52 of the pusher element 48 initially gently ride down the ramp surfaces 60 of the conveyor mechanism 38. It is to be appreciated that the pusher element 48, at this time, is still supporting the entire weight of the stacked array 13 contained within the supply bin 32 as well as the entire weight of the elevator assembly 88. Accordingly, as the pusher element 48 is returned back toward the initial idle position of FIG. 6, the weight of the stacked array 13 continuously biases the pusher member 48 downward against the bottom surface 33 of the supply bin 32 (FIG. 10).

As the pusher element 48 nears the completion of its return stroke, the chamfer 56 of the arms 51, 52 are allowed to be gradually lowered into a pair of recesses 62 (see FIGS. 10 and 11), provided in the bottom surface 33 of the supply bin 32, by riding along a pair of mating bin ramp surfaces 64. Each of the recesses 62 is sized to completely accommodate one of the two arms 51, 52. This lowering action facilitates a gentle lowering of the entire stacked array 13 onto the bottom surface 33 of the supply bin 32. During the final portion of the return stroke of the pusher element 48, the stacked array 13 is completely disengaged from the pusher element 48 (see FIG. 12) which allows the pusher element 48 to slightly rebound or spring back to its original idle position, shown in FIG. 6, so that the pusher element 48 is again properly aligned to separate the next lower most carrier member 12 from the remainder of the stacked array 13. The spring and thread screw arrangement 55 facilitates cushioning and realignment of the leading edge of the pusher element 48 with the joint between the two lower most carrier members 12.

Figure 14:
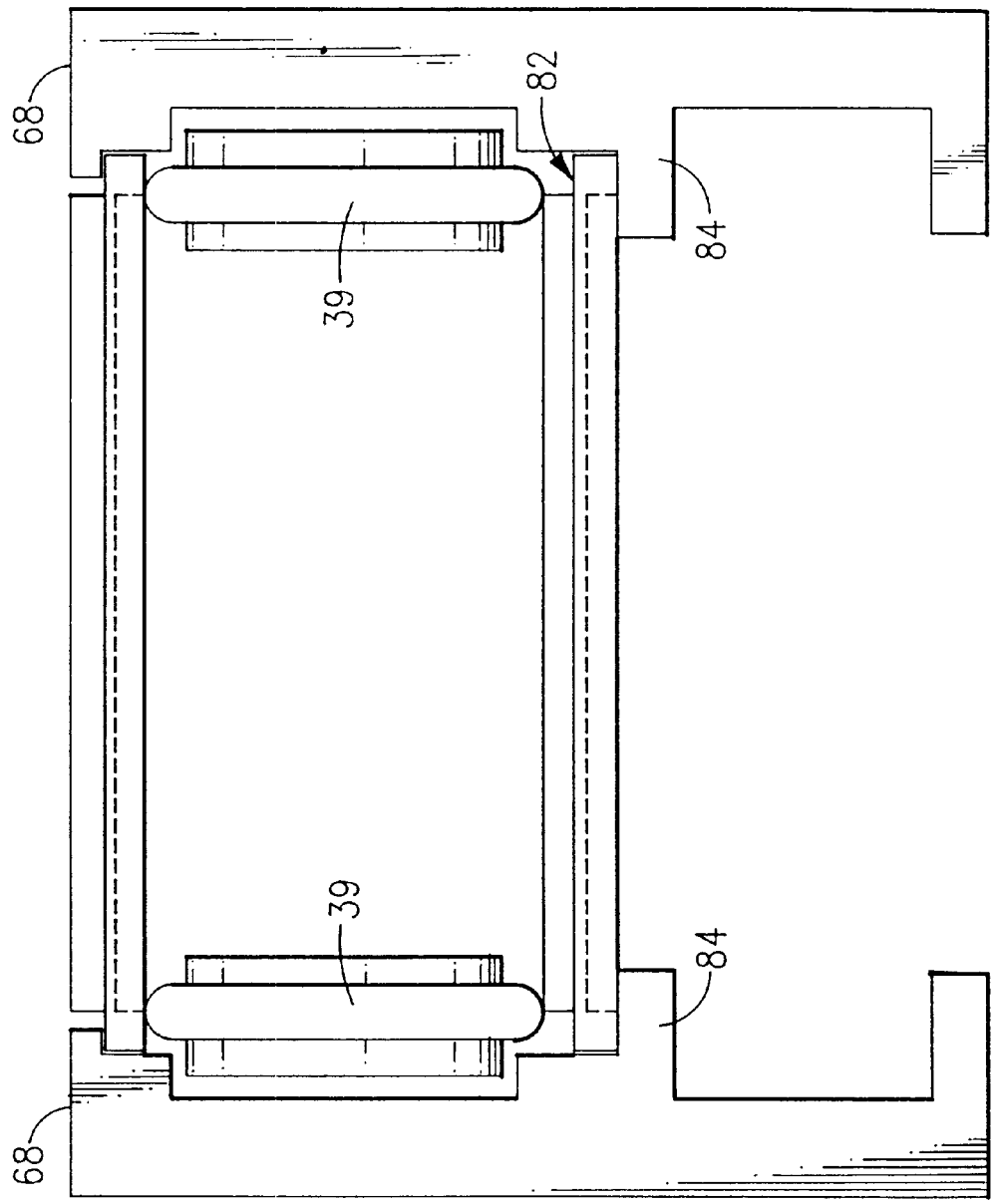
FIG. 14 is a cross-sectional view of the conveyor mechanism of FIG. 5 along section line 14—14.

Turning now to FIGS. 14–17, a detailed description concerning the operation and function of the conveyor mechanism 38 and the automated assembly retrieval area 40 will now be provided. As can be seen in FIG. 14, the conveyor mechanism 38 is provided with a pair of opposed guide rails 68 which facilitate sandwiching of the carrier member 12 between inwardly and downwardly facing surfaces of the guide rails 68 and top surfaces of the conveyor belts 39. The conveyor belts 39 can be driven by an electric motor or any other conventional drive mechanism which is well known in this art. As such drive feature is well known, a further detailed description concerning the same is not provided herein.

At the automated assembly retrieval area 40 of the conveyor mechanism 38 (FIG. 15), the guide rails 68 facilitate conveying of the carrier member 12 out over a second return roller 70 of the conveyor mechanism 38, in a cantilevered fashion, until a leading end 72 of the carrier member 12 abuts against the movable stop 74 while the opposite end 76 of the carrier member 12 is still sandwiched between the inwardly and downwardly facing surfaces of the guide rails 68 and the top surface of the conveyor belt 39. Once the carrier member 12 abuts against the movable stop 74, the conveyor belts 39 of the conveyor mechanism 38 are stopped.

According to a preferred form of the present invention, the conveyor belts 39 of the conveyor mechanism 38 are simultaneously rotated by the motor M for predetermined period of time and once this time period has elapsed, the conveyor mechanism 38 is automatically stopped. Typically, the time period is about 3 to 4 seconds which is a sufficient amount of time to facilitate loading of a carrier member 12 onto the first section 36 of the conveyor mechanism 38 and ensure complete conveyance of the carrier member 12 against the movable stop 74. If desired, the conveyor mechanism 38 can operate for a slightly longer time period, e.g. a quarter of a second or so, to ensure that the leading end 72 of the carrier member 12 is in an abutting relationship with the stop member 74 and partially supported by a stop shoulder 75 of the stop member 74. The carrier member 12 remains in this position until the conveyor mechanism 38 is again activated.

Opposed surfaces of the stop member 74 can be provided with a sensor 77 (FIG. 5) which determines when the carrier member 12 is located between those opposed surfaces. A preferred sensor 77 is a through beam sensor in which the beam is interrupted when the carrier member 12 is present at the automated assembly retrieval area 40. This sensor 77 facilitates communication with a computer C, for example, to determine that a carrier member 12 is located at the automated assembly retrieval area 40 of the present invention. If the sensor 77 does not determine that a carrier member 12 is located in the automated assembly retrieval area 40, the feed mechanism 34 is again cycled so that a carrier member 12 is conveyed to the automated assembly retrieval area 40.

Due to the abutting and the sandwiching arrangement, the conveyed carrier member 12 is firmly supported, in the automated assembly retrieval area 40, to prevent inadvertent pick up of the carrier member 12 itself by retrieval equipment of the automated assembly system 2, i.e. only the components 18 are able to be retrieved. The carrier member 12 is maintained in this position until all of the components 18, carried by the carrier member 12, are properly retrieved by the automated assembly system 2. Once this has occurred, the movable stop 74 is moved in the direction of arrow C, by a pneumatic cylinder 78, connected to the movable stop 74 via rod 79 (FIG. 16) and operated by the pressure source 57, and the conveyor mechanism 38 is also activated to again rotate in a clockwise fashion for another timed duration. Such rotation initially conveys the carrier member 12 toward the movable stop 74, which has been displaced by the pneumatic cylinder 78 away from the second return roller 70, which causes the opposite end 76 of the carrier member 12, previously supported by the second return roller 70 of the conveyor mechanism 38, to move initially in the direction of arrow C and then fall toward a bottom surface 80 of the conveyor mechanism 38 where the carrier member 12 is temporarily supported by framework 83 of the conveyor mechanism 38.

Figure 15:
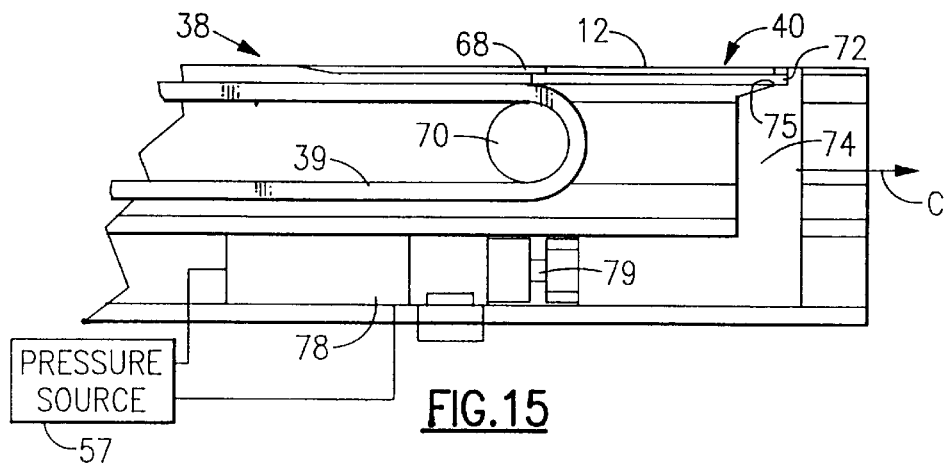
FIGS. 15 through 17 are diagrammatic views showing the feed sequence by the conveyor mechanism of a stacked carrier member at the automated assembly retrieval area.
Figure 16:
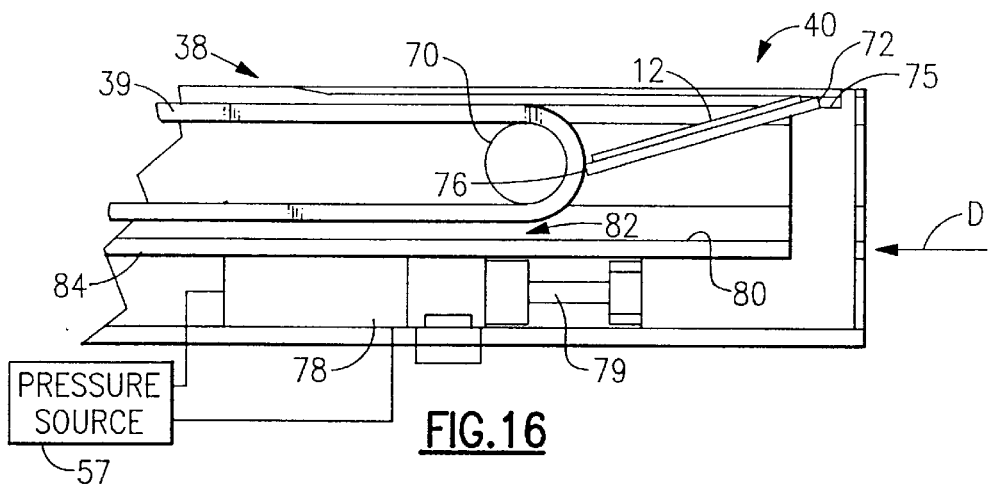
Figure 17:
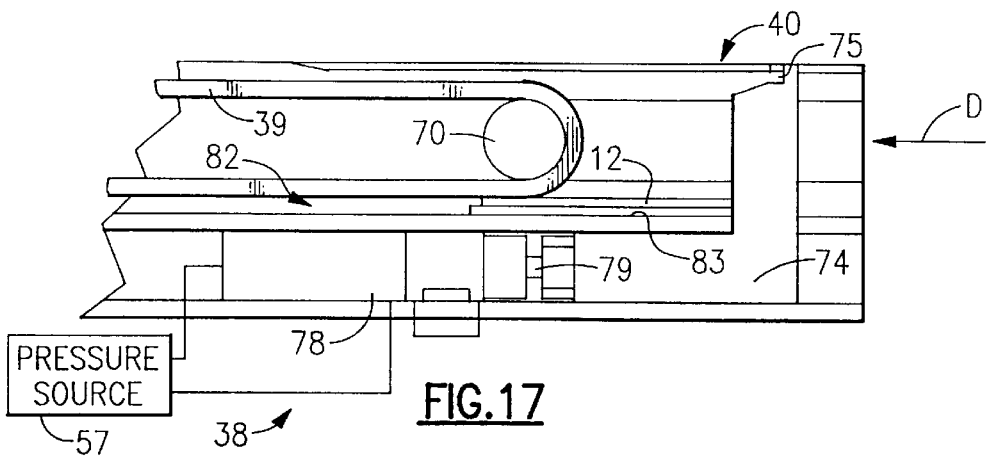

As can be seen in FIGS. 15 and 16, the stop shoulder 75 facilitates support of the leading edge 72 of the carrier member 12. Once the carrier member 12 has landed, the movable stop 74 is returned by the pneumatic cylinder 78 back to its initial position, in the direction of arrow D, and such return stroke pushes the emptied carrier member 12 into the lower return channel 82 of the conveyor mechanism 38 where the emptied carrier member 12 is conveyed back toward the collection bin 44. In a preferred form of the present invention, both pneumatic cylinders 46, 78 are coupled to the same pressure source 57 and operate in unison with one another. That is, when the pneumatic cylinder 46 moves in the direction of arrow A, the pneumatic cylinder 78 simultaneously moves the movable stop 74 away from the second return roller 70 of the conveyor belts 39 in the direction of arrow C. In addition, when the pneumatic cylinder 46 is reversed, due to activation of the sensor 61, the pneumatic cylinder 78 is also reversed to push the emptied carrier member 12 into the lower return channel 82 of the conveyor mechanism 38.

In the return channel 82, the carrier member 12 is guided by a lower pair of opposed guide rails 84 (FIG. 14) which facilitates sandwiching the carrier member 12 between inwardly and upwardly facing surfaces of the guide rails 84 and the downwardly facing surfaces of the conveyor belts 39. If desired, the inwardly and upwardly facing surfaces of the guide rails 84 and the inwardly and downwardly facing surfaces of the guide rails 68 can be provided with an anti-friction coating, such as polytetrafluoroethylene or nickel, to facilitate conveying of the carrier members 12 therealong. The carrier member 12 is conveyed along the guide rails 84 until it reaches a location adjacent the feed mechanism 34. At the end of the return channel 82, the conveyor mechanism 38 discharges the emptied carrier member 12, via the exit 91, into the collection bin 44. As the motor M of the conveyor mechanism 38 is only operated for a timed period, it is to be appreciated that the carrier member 12 may not be discharged from the conveyor mechanism 38 until the motor M again cycles to supply a further carrier member 12 containing additional components 18 to be dispensed.

In a preferred form of the invention, the collection bin 44 includes an elevator assembly 88 which maintains a desired spacing between the lower portion of the guide rails 84 of the conveyor mechanism 38 and either a bottom surface 90 of the collection bin 44 or a top surface of the top most carrier member 12 contained within the collection bin 44. Due to this constant spacing arrangement, it is ensured that as each carrier member 12 is collected within the collection bin 44, the collection bin 44 is gradually moved downwardly away from the exit 91 of the conveyor mechanism 38, due the weight of the collected carrier members 12, to facilitate maintaining the desired space and ensuring stacked collection of the carrier members 12. The desired spacing is about 1.5 inches ±0.5 inches. Due to the elevator assembly 88, it is ensured that each carrier member 12, as it is discharged by the conveyor belt 39 of the conveyor mechanism 38, is properly deposited into the collection bin 44 to facilitate collection of the carrier members 12 in a stacked array with one another for reuse.

The collection bin 44 is manufactured as a part of the elevator assembly 88. In order to load the conveying apparatus 30 with a new supply of carrier members 12 (FIG. 4), the elevator assembly 88 is lifted in the direction of arrow E so that the bottom surface 90 of the collection bin 44 is located closely adjacent the guide rails 84 of the conveyor mechanism 38. Once in this position, the supply bin 32 can be loaded with a desired quantity of carrier members, e.g. about 50 waffle packs. Thereafter, the elevator assembly 88 is allowed to move in the direction of arrow F, due to the force of gravity, until a top inwardly facing surface 92 of the elevator assembly 88 rests upon a top surface of the top-most carrier member 12. Thereafter, the conveying apparatus 30, according to the present invention, is ready for use.

As a new carrier member 12 containing additional components 18 is desired, the pusher element 48 is operated to separate the lower most carrier member 112 from the remainder of the stacked array 13 and this feed motion of the pusher element 48 also lifts the elevator assembly 88 slightly. Once the pusher element 48 is again completely removed from the stacked array 13 (FIG. 12), the elevator assembly 88 is lowered by an incremental amount which is equal to the height H2 of one of the stacked carrier members 12. The bottom surface 90 of the elevator is lowered by an equivalent amount, i.e. distance H2, but an additional carrier member has also been collected by the collection bin 44. This incremental lowering feature of the elevator assembly 88 maintains the desired spacing S between the lower portion of the guide rails 84 of the conveyor mechanism 38 and either the bottom surface 90 of the collection bin 44 or a top surface 14 of the top-most carrier member 12 contained within the collection bin 44.

As can be seen more clearly in FIGS. 4 and 5, opposed sidewalls 100 of both the supply bin 32 and the collection bin 44 are each provided with an elongate slot 102 therein. The two elongate slots 102 each accommodate one of the legs 89 of the elevator assembly 88 and allow sliding movement of the elevator assembly 88 relative to the supply bin 32.

Figure 18:
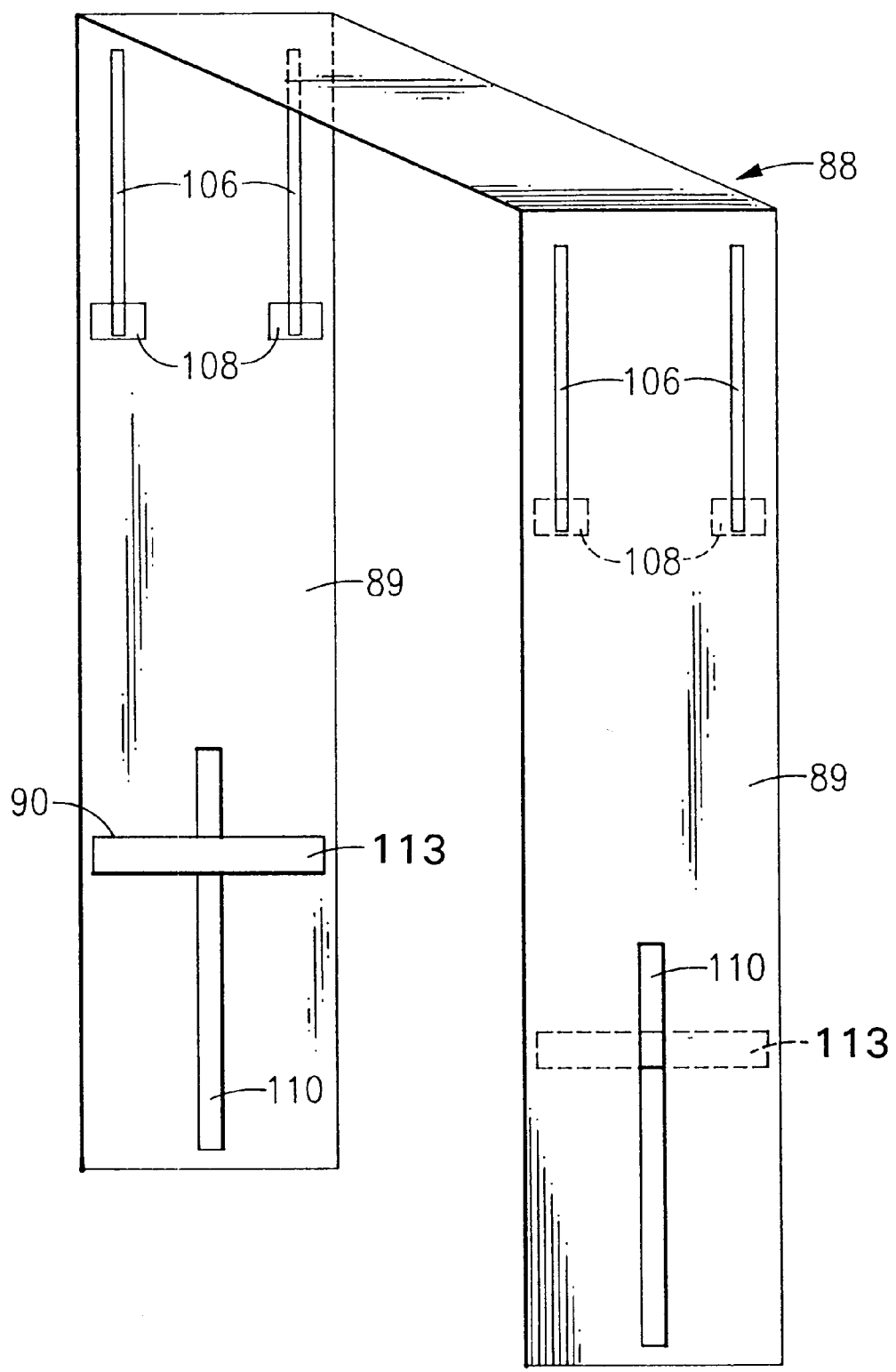
FIG. 18 is a diagrammatic perspective view showing the elevator assembly, according to the present invention.

Turning now to FIG. 18, four elongate slots 106 are provided in the top portion of the elevator assembly 88. Each one of the four elongate slots 106 accommodates a freely movable and slidable support member 108 which is slidable along the length of the elongate slot 106. As can be seen in FIG. 18, two of the elongate slots 106 are located adjacent, but spaced from one another, in a first one of the two side legs 89 of the elevator assembly 88 while the other two elongate slots 106 are similarly arranged in the other opposed side leg 89. The four slidable support members 108 facilitate supporting of a plurality of nested carrier members 12 when the elevator assembly 88 is in a fully raised position (moved in the direction of arrow E), and the four slidable support members 108 hold and facilitate gently lowering of the loaded and nested carrier members 12 onto the bottom surface 33 of the storage bin 32. Once the loaded carrier members 12 rest against the bottom surface 33 of the storage bin 32, the elevator assembly 88 is allowed to continue to fall, under the force of gravity, until the top surface 92 of the elevator assembly 88 is in an abutting relationship with a top surface of the top most carrier member 12. The four slidable support members 108 are each completely received within an aperture (not shown) provided in the bottom surface 33 so that the bottom surface 33 eventually supports the loaded carrier members 12.

A lower elongate slot 110 is provided in the lower portion of each one of the side legs 89 of the elevator assembly 88. Each one of the lower elongate slots 110 accommodates a slidable support element 113 which forms the bottom surface of the collection bin 44 and supports the carrier members 12 as they are discharged from the exit 91 of the conveyor mechanisms 38 and collected in the collection bin 44. The position of the support elements 113 is adjustable along the length of the respective lower elongate slots 110 to adjust the position of a top surface 90 of the support element 113, i.e. the bottom surface 90 of the collection bin 44 from the exit 91 of the conveyor mechanism 38 to maintain the desired spacing S referred to above. It is preferred that each one of the support elements 113 is biased away from but still retained by the legs 89 by a pair of ball plungers, springs or some other biasing mechanism. This arrangement allows the support elements 112 to be moved along the lower elongate slots 110 but still facilitates maintaining the support elements 113 in their adjusted position.

Once the collection bin 44 has collected a desired amount of stacked carrier members 12, the door 96 may be pivoted, via pivot 98, to an open position to facilitate removal of the stacked carrier members 12 from the collection bin 44. Following this, the door 96 is repivoted back to its in use position to facilitate further collection of additional carrier members 12 in the collection bin 44.

It is to be appreciated that the pneumatic system 46, 57 and 87, as well as the electric motor M disclosed above can both be coupled to and controlled by a computer C (FIG. 4). The computer C can, in turn, be coupled to the automatic assembly system 2 so that when the automatic assembly system 2 desires additional components to be assembled, the computer activates the feed mechanism 34, of the present invention, to operate so that the emptied carrier member 12 is conveyed from the automated assembly retrieval area 40 to the collection bin 44 and a further carrier member 12, containing a new supply of components 18 to be assembled, is conveyed to the automated assembly retrieval area 40 of the present invention.

The inventor also contemplates that a plurality of similar or identical conveyor apparatuses 30, according to the present invention, can be arranged side by side next to one another to supply various components to the automated assembly system 2 while occupying a minimal amount of working area within the automated assembly system. It is to be appreciated that the conveying apparatus 30, according to the present invention, can be mounted on a stand, if desired, or can be secured directly to the automatic assembly system 2 by conventional mounting brackets.

While the pusher element 48 and the movable stop 74 are both indicated as being operated by pneumatic cylinders or the like, it is to be appreciated that those two components can be operated by electric motors or any other known or conventional drive mechanism.

Since certain changes may be made in the above described, without departing from the spirit and scope of the invention herein involved, it is intended that all of the subject matter of the above description or shown in the accompanying drawings shall be interpreted merely as examples illustrating the inventive concept herein and shall not be construed as limiting the invention.

Wherefore, I claim:

1. A conveying apparatus for sequentially feeding a plurality of stacked carrier members each carrying a plurality of components to be assembled, said conveying apparatus comprising:

a supply bin for storing a desired quantity of stacked carrier members, said supply bin having a bottom surface and an outlet for sequentially discharging a carrier member therefrom;

a feed mechanism communicating with said outlet of said supply bin, said feed mechanism having a pusher element for facilitating individual feeding of said carrier members, in a sequential manner, when located within said supply bin, and said pusher element being pivotally connected to said feed mechanism, in a cantilevered fashion, to facilitate alignment of a leading edge of said pusher element between a lower most carrier member and an adjacent second lower most carrier member, and said pivotal cantilever connection of said pusher element facilitating release of a said carrier member and a gradual lowering of a remainder of the stacked carrier members onto the bottom surface of the supply bin; and a conveyor mechanism communicating with said outlet of said supply bin for receiving said carrier member, fed by said feed mechanism, and for conveying said carrier member to an automated assembly retrieval area where said plurality of components of said carrier member can be retrieved to manufacture a desired product.

2. The conveying apparatus according to claim 1, wherein said pusher element has a pair of arms for facilitating lifting and separating of the lower most carrier member from the remainder of the stacked carrier members, said pusher element has a pusher surface for facilitating feeding of the lower most carrier member onto a first section of said conveyor mechanism; and said bottom surface of said supply bin, adjacent said outlet of said supply bin, is provided with a pair of spaced apart recesses which have mating ramp surfaces located to each mate with one of said pair of arms of said pusher element to facilitate the gradual lowering of the remainder of the stacked carrier members onto said bottom surface of said supply bin.

3. The conveying apparatus according to claim 2, wherein a cylinder member is coupled to said pusher element for moving said pusher element in a first direction for feeding the lower most carrier member onto the first section of said conveyor mechanism and, upon completion of a feed cycle, for returning said pusher element back to its initial idle position.

4. The conveying apparatus according to claim 3, wherein said pair of arms are each provided with a chamfer, adjacent a leading edge thereof, to facilitate separation of two adjacent stacked carrier members from one another.

5. The conveying apparatus according to claim 4, wherein said first section of said conveyor mechanism is provided with a pair of ramp surfaces which are each positioned to mate with one of said chambers on said pair of arms of said pusher element to facilitate release of said carrier member onto said first section of said conveyor mechanism; and said bottom surface of said supply bin, adjacent said outlet of said supply bin, is provided with said pair of spaced apart recesses which have mating ramp surfaces located to each mate with one of said chambers on said pair of arms of said pusher element to facilitate the gradual lowering of the remainder of the stacked carrier members onto said bottom surface of said supply bin.

6. The conveying apparatus according to claim 1, wherein said conveyor mechanism comprises at least one endless conveyor belt which rotates about at least first and second return rollers; and a pair of opposed guide rails are provided along at least a portion of both a supply channel and a return channel of said conveyor mechanism to facilitate sandwiching of said carrier member between said guide rails and said at least one conveyor belt to prevent said carrier member from being inadvertently dislodged from said conveyor mechanism.

7. The conveying apparatus according to claim 6, wherein said automated assembly retrieval area of said conveyor mechanism is provided with a movable stop, said movable stop has a first position in which said movable stop is located to captively retain, with said supply channel of said conveyor mechanism, said carrier member at said automated assembly retrieval area of said conveyor mechanism; and a second retracted position in which said movable stop is retracted and allows said carrier member to fall onto said return channel of said conveyor mechanism, due to gravity, and a return motion of said movable stop to the first position pushes said carrier member into engagement with said at least one conveyor belt of said return channel of said conveyor mechanism for conveying said carrier member toward a collection bin.

8. The conveying apparatus according to claim 7, wherein said collection bin is located adjacent an exit of said return channel of said conveyor mechanism for collecting said carrier members in a stacked array for subsequent reuse.

9. The conveying apparatus according to claim 8, wherein said collection bin has a door pivotally mounted thereto, said door has a first closed position in which said door facilitates collection of said carrier members and a second pivoted open position in which said door facilitates retrieval of said stacked array of carrier members from said collection bin.

10. The conveying apparatus according to claim 8, wherein said collection bin is located directly beneath said supply bin, and wherein said conveying apparatus comprises an elevator assembly, a first portion of said elevator assembly engages with a top most carrier member located within said supply bin and a second portion of said elevator assembly engages with a bottom most carrier member located within said collection bin.

11. The conveying apparatus according to claim 10, wherein said elevator assembly includes a mechanism which incrementally lowers said elevator assembly from said supply bin toward said collection bin as each said carrier member is sequentially fed from said supply bin.

12. The conveying apparatus according to claim 11, wherein said elevator assembly is provided with a pivotable door which facilitates retrieval of said stacked array of carrier members from said collection bin.

13. The conveying apparatus according to claim 4, wherein said pusher element includes an adjustment mechanism for facilitating adjustment of the leading edge of said pair of arms to facilitate separation of the lower most carrier member and the adjacent second lower most carrier member from one another.

14. The conveying apparatus according to claim 7, wherein said movable stop is connected to a movable stop pneumatic cylinder, via a rod, to facilitate moving of said movable stop from said first position to said second retracted position and vice versa.

15. The conveying apparatus according to claim 1, wherein said carrier member is provided with a plurality of cavities, on a top surface thereof, and each one of said plurality of cavities carries one component to be assembled.

16. A conveying apparatus for sequentially feeding a plurality of stacked carrier members each carrying a plurality of components to be assembled, said conveying apparatus comprising:

a supply bin for storing a desired quantity of stacked carrier members, said supply bin having a bottom surface and an outlet for sequentially discharging a carrier member therefrom;

a feed mechanism communicating with said outlet of said supply bins, said feed mechanism facilitating feeding of said carrier members, in a sequential manner, when located within said supply bin; and a conveyor mechanism communicating with said outlet of said supply bin for receiving said carrier member, fed by said feed mechanism, and for conveying said carrier member to an automated assembly retrieval area where said plurality of components of said carrier member can be retrieved to manufacture a desired product;

wherein said feed mechanism comprises a pusher element which has a pair of arms for facilitating lifting and separating of a lower most carrier member from a remainder of the stacked carrier members, and said pusher element has a pusher surface for facilitating feeding of the lower most carrier member onto a first section of said conveyor mechanism;

a drive is coupled to said pusher element for moving said pusher element in a first direction for feeding the lower most carrier member onto the first section of said conveyor mechanism and, upon completion of a feed cycle, for returning said pusher element back to its initial idle position;

said automated assembly retrieval area of said conveyor mechanism is provided with a movable stop, said movable stop has a first position in which said movable stop is located to captively retain, with a supply channel of said conveyor mechanism, said carrier member at said automated assembly retrieval area of said conveyor mechanism; and a second retracted position in which said movable stop is retracted and allows said carrier member to fall to a bottom surface of said conveyor mechanism, due to gravity, and a return motion of said movable stop to the first position pushes said carrier member into engagement with a conveyor belt of a return channel of said conveyor mechanism for conveying said carrier member toward a collection bin.

17. The conveying apparatus according to claim 16, wherein said first section of said conveyor mechanism is provided with a pair of ramp surfaces which are each positioned to mate with a chamfer on said pair of arms of said pusher element to facilitate release of said carrier member onto said first section of said conveyor mechanism; and a bottom surface of said supply bin, adjacent said outlet of said supply bin, is provided with a pair of spaced apart recesses which have mating ramp surfaces located to each mate with one of said chambers on said pair of arms of said pusher element to facilitate gradual lowering of the remainder of the stacked carrier members onto said bottom surface of said storage bin.

18. The conveying apparatus according to claim 17, wherein said conveyor mechanism comprises the conveyor belt which rotates about at least first and second return rollers; and a pair of opposed guide rails are provided along at least a portion of both a supply channel and the return channel of said conveyor mechanism to facilitate sandwiching of said carrier member between said guide rails and said conveyor belt to prevent said carrier member from being inadvertently dislodged from said conveyor mechanism.

19. The conveying apparatus according to claim 18, wherein said movable stop is connected to a movable stop pneumatic cylinder, via a rod, to facilitate moving of said movable stop from said first position to said second retracted position and vice versa.

20. A method for sequentially feeding a plurality of stacked carrier members each carrying a plurality of components to be assembled, said method comprising the steps of:

storing a desired quantity of stackable carrier members on a bottom surface of a supply bin;

providing said supply bin with an outlet for sequentially discharging said carrier members therefrom;

providing a feed mechanism having a pusher element communicating with said outlet of said supply bin;

pivotally connecting said pusher element to said feed mechanism, in a cantilevered fashion, to facilitate alignment of a leading edge of said pusher element between a lower most carrier member and an adjacent second lower most carrier member, and said pivotal cantilever connection of said pusher element facilitating release of a said carrier member and a gradual lowering of a remainder of the stacked carrier members onto the bottom surface of the supply bin;

feeding in a sequential manner, via said feed mechanism, one of said carrier members as desired;

receiving and conveying said sequentially fed carrier member, via a conveyor mechanism, to an automated assembly retrieval area where said plurality of components of said carrier member can be retrieved to manufacture a desired product; and collecting each sequentially fed carrier member in a collection bin once said plurality of components of said carrier member are retrieved therefrom to manufacture a desired product.

\* \* \* \* \*